United States Patent
Cheng et al.

(10) Patent No.: US 7,726,540 B2
(45) Date of Patent: Jun. 1, 2010

(54) APPARATUS AND METHOD FOR ARRANGING DEVICES FOR PROCESSING

(75) Inventors: Chi Wah Cheng, Hong Kong (CN); Hoi Shuen Joseph Tang, Hong Kong (CN); Tim Wai Tony Mak, Hong Kong (CN); See Lok Chan, Hong Kong (CN)

(73) Assignee: ASM Assembly Automation Ltd. (HK)

( * ) Notice: Subject to any disclaimer, the term of this patent is extended or adjusted under 35 U.S.C. 154(b) by 557 days.

(21) Appl. No.: 11/301,064

(22) Filed: Dec. 12, 2005

(65) Prior Publication Data

US 2007/0131733 A1   Jun. 14, 2007

(51) Int. Cl.
*B23K 1/14* (2006.01)
*B23K 5/22* (2006.01)
*H01R 43/00* (2006.01)

(52) U.S. Cl. .................... 228/49.1; 228/212; 29/759
(58) Field of Classification Search ... 228/180.1–180.5, 228/212, 213, 248.1, 44.3, 44.7, 49.1, 49.5; 269/9, 10, 289 R, 903; 29/759, 760
See application file for complete search history.

(56) References Cited

U.S. PATENT DOCUMENTS

| | | | | |
|---|---|---|---|---|
| 3,466,514 A | * | 9/1969 | Brunner et al. | 318/577 |
| 3,775,644 A | * | 11/1973 | Cotner et al. | 361/769 |
| 4,270,267 A | * | 6/1981 | Bakermans | 29/881 |
| 4,316,321 A | * | 2/1982 | Wickham | 29/845 |
| 4,860,439 A | * | 8/1989 | Riley | 29/741 |
| 5,688,127 A | | 11/1997 | Staab et al. | 439/66 |
| 5,850,689 A | * | 12/1998 | Mogi et al. | 29/834 |
| 5,911,257 A | * | 6/1999 | Morikawa et al. | 15/88.2 |
| 5,932,065 A | * | 8/1999 | Mitchell | 156/556 |
| 5,974,654 A | * | 11/1999 | Morita | 29/559 |
| 6,043,667 A | * | 3/2000 | Cadwallader et al. | 324/758 |
| 6,190,997 B1 | * | 2/2001 | Becker et al. | 438/401 |
| 6,338,297 B1 | | 1/2002 | Wang et al. | 101/126 |
| 6,354,480 B2 | * | 3/2002 | Higashi et al. | 228/9 |
| 6,398,098 B1 | * | 6/2002 | Kada | 228/4.5 |
| 6,422,452 B2 | * | 7/2002 | Yamamoto et al. | 228/246 |
| 6,550,662 B2 | * | 4/2003 | Too | 228/39 |
| 6,635,308 B1 | * | 10/2003 | Forrest et al. | 427/96.2 |
| 6,708,965 B2 | * | 3/2004 | Nuxoll et al. | 269/118 |
| 6,760,968 B2 | * | 7/2004 | Mimata et al. | 29/740 |
| 6,899,262 B2 | * | 5/2005 | Gaunekar et al. | 228/44.3 |
| 6,945,381 B2 | * | 9/2005 | Miura et al. | 198/345.1 |

(Continued)

FOREIGN PATENT DOCUMENTS

JP       08078417 A   *   3/1996

*Primary Examiner*—Jessica L. Ward
*Assistant Examiner*—Carlos Gamino
(74) *Attorney, Agent, or Firm*—Ostrolenk Faber LLP (57) ABSTRACT

An apparatus is provided for arranging for processing a semiconductor device having surface components on its surface. A device support comprising a set of protrusions for contacting a surface of the semiconductor device supports the semiconductor device on a plane. The protrusions are arranged and positioned such that they avoid contact with the surface components on the surface. In order to grip the semiconductor device supported on the plane, a clamping device having a first set of clamps is configured for gripping the semiconductor device along a first axis and a second set of clamps is configured for gripping the semiconductor device along a second axis perpendicular to the first axis.

11 Claims, 4 Drawing Sheets

U.S. PATENT DOCUMENTS

| | | | |
|---|---|---|---|
| 7,258,703 B2 * | 8/2007 | Cheng et al. | 29/25.01 |
| 2003/0017629 A1 * | 1/2003 | Tsui et al. | 438/14 |
| 2003/0042626 A1 | 3/2003 | Howarth | 257/797 |
| 2004/0035913 A1 * | 2/2004 | Ball | 228/110.1 |
| 2005/0126028 A1 * | 6/2005 | Lim et al. | 33/645 |
| 2006/0278683 A1 * | 12/2006 | Otsuka et al. | 228/44.3 |

\* cited by examiner

APPARATUS AND METHOD FOR ARRANGING DEVICES FOR PROCESSING

FIELD OF THE INVENTION

The invention relates to the processing of devices, and in particular to arranging devices on a carrier and aligning them with respect to a processing system for processing.

BACKGROUND AND PRIOR ART

Semiconductor devices such as Ball Grid Array ("BGA") packages are usually small in size and are transported and/or processed in batches so as to increase operation efficiency. Thus, they are often loaded on a carrier in array form for transportation and processing. Examples of processes carried out on BGA packages arranged in array form include solder paste printing, solder balls attaching and testing. Processing of several or all semiconductor devices in a carrier simultaneously results in high throughput, but that in turn requires precise alignment of the devices on the carrier prior to processing. Poor alignment of the devices will directly affect the yield of processes subsequent to alignment. Alignment capability and accuracy becomes even more critical for fine pitch devices.

Various approaches have been implemented in the prior art to align semiconductor devices on carriers. In a cavity approach, a guiding plate with a cavity opened for receiving a semiconductor device is used for aligning it with respect to edges of the device. In U.S. Pat. No. 5,688,127 entitled "Universal Contactor System for Testing Ball Grid Array (BGA) Devices on Multiple Handlers and Method Therefor", a cavity approach is described wherein a guide plate has a cavity that is adapted to receive a BGA package for alignment. The opening size of the cavity is reduced gradually from the device entrance point to the inner portion of the cavity. The BGA package is guided by the narrowing opening and is aligned with the interior walls of the cavity at the inner portion.

A problem with this approach is that a clearance must exist between the BGA package and interior walls of the cavity to avoid jamming of the device. Also, additional clearance should be added to accommodate any variation in sizes of different BGA packages resulting from a prior singulation process. The resultant clearance between the BGA package and cavity may result in poor alignment. Furthermore, the guiding interaction between the interior walls of the cavity and BGA packages may cause potential tilting or dislocation of packages especially if the initial misalignment is large.

Alternatively, in a pin approach, two or more pins are used to align semiconductor devices with respect to a carrier, with apertures formed in both the devices and the carrier for the pins to pass through for alignment. The pin approach to align semiconductor devices with respect to a carrier is described in U.S. Pat. No. 6,338,297 entitled "Precise and Rapid Positioning Mechanism for Stencil Printing" and U.S. patent publication number 2003/042626A1 entitled "Method of Ball Grid Array (BGA) Alignment, Method of Testing, Alignment Apparatus and Semiconductor Device Assembly". According to the pin approach, two or more apertures are formed in each semiconductor device, with the carrier having the same pattern of apertures at each landing site for the semiconductor devices. Apertures in the semiconductor devices and carrier are pre-aligned, with pins passing through the apertures of both parts to assist alignment.

This approach has the shortcoming that holes have to be formed in the semiconductor devices, which reduces the area available for placing input/output connections. Also, the holes reduce the area available for a suction cup to pick up the devices during pick-and-place operations using vacuum suction. Another shortcoming is that unless the pins and apertures in both semiconductor devices and carriers have minimal clearance, precise alignment cannot be achieved. However, it becomes very difficult, if not impossible, to align a plurality of semiconductor devices with the carrier by automated means if the pins and apertures are of similar size so that they fit tightly. This may require manual alignment that is not preferable for high volume production. Even if automated means can be applied, the striking of the pins into corresponding apertures of unaligned semiconductor devices may cause potential tilting or dislocation.

In the case of semiconductor devices that are densely populated with surface components such as Surface-Mount Technology ("SMT") type components on the surface to be supported, there is an additional problem of providing adequate support for the devices. If the fragile surface components are forcibly biased against a supporting structure, they may be damaged. Due to this need to avoid direct contact between the supporting structure and the surface components on the supported surface, the use of means such as vacuum suction for holding the semiconductor device would be problematic because there would be very little surface area on which to apply the vacuum pressure. Thus, the vacuum suction would be relatively weaker, which may result in unintended pick-up or dislodgement when a process head such as sticky flux transfer pins contact the surface of the device being processed.

SUMMARY OF THE INVENTION

It is therefore an object of the invention to provide an alignment apparatus and method that seeks to overcome at least some of the disadvantages of the aforesaid prior art. It is a related object of the invention to provide an apparatus and method for effectively arranging and aligning semiconductor devices containing surface components such that a limited surface area is available for contact by a structure supporting the devices.

According to a first aspect of the invention, there is provided an apparatus for arranging for processing a semiconductor device having surface components on its surface, the apparatus comprising: a device support comprising a set of protrusions for contacting a surface of the semiconductor device to support the semiconductor device on a plane, the protrusions being arranged and positioned such that they avoid contact with the surface components on the surface; and a clamping device having a first set of clamps configured for gripping the semiconductor device along a first axis and a second set of clamps configured for gripping the semiconductor device along a second axis perpendicular to the first axis, whereby to grip the semiconductor device supported on the plane.

According to a second aspect of the invention, there is provided a method of arranging a semiconductor device using the apparatus as claimed in claim 1, comprising the steps of: moving a reference clamp from each set of clamps to provide a reference guide in each respective axis; moving a gripping clamp from the first set of clamps to clamp the semiconductor device against the reference clamp along the first axis; moving the gripping clamp from the first set of clamps to unclamp the semiconductor device; moving a gripping clamp from the second set of clamps to clamp the semiconductor device against the reference clamp along the second axis; and thereafter moving the gripping clamp from the first set of clamps to clamp the semiconductor device, whereby to securely align and hold onto the semiconductor device.

According to a third aspect of the invention, there is provided an apparatus for arranging for processing a plurality of semiconductor devices having surface components on their surfaces, the apparatus comprising: a plurality of device supports, each device support comprising a set of protrusions for contacting a surface of a semiconductor device to support the semiconductor device on a plane, the protrusions being arranged and positioned such that they avoid contact with surface components on the surface; a plurality of clamping devices, each having a first set of clamps configured for gripping a semiconductor device along a first axis and a second set of clamps configured for gripping the semiconductor device along a second axis perpendicular to the first axis whereby to grip the semiconductor device supported on the plane; and a carrier for mounting said plurality of clamping devices and device supports.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and methods for arranging devices for processing in accordance with the invention will now be described with reference to the accompanying drawings, in which.

DETAILED DESCRIPTION OF THE PREFERRED EMBODIMENT OF THE INVENTION

Figure 1A:
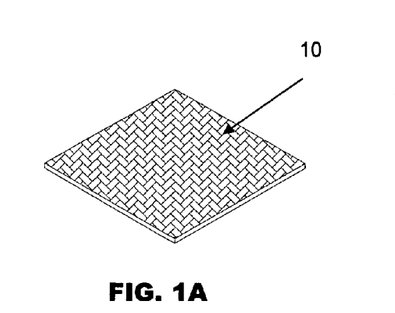
FIGS. 1A and 1B show a top surface and a back surface respectively of a semiconductor device that is densely populated with surface components on the back surface.
Figure 1B:
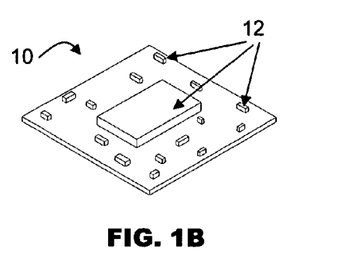

FIGS. 1A and 1B show a top surface and a back surface respectively of a semiconductor device 10 that is densely populated with surface components 12 on the back surface. FIG. 1A shows a BGA device 10 that is ready to undergo subsequent processing such as solder paste printing or solder ball placement. In this orientation, the top surface is adapted to be processed, for example by receiving solder paste or solder balls on the top or processed surface.

Referring now to FIG. 1B showing the back surface of the device 10 that is used for support, the semiconductor device 10 is densely populated with surface components 12 (such as SMT components) on the said surface. The back surface or supporting surface is to be contacted and supported by a supporting structure during processing of the device 10. Since the supporting structure should not be allowed to apply any force on the surface components 12 to avoid damaging them, this results in a very limited area for access by an alignment apparatus on the support surface of the semiconductor device 10. It is thus difficult using prior art apparatus and methods to reliability hold and align the device using this support surface.

Figure 2A:
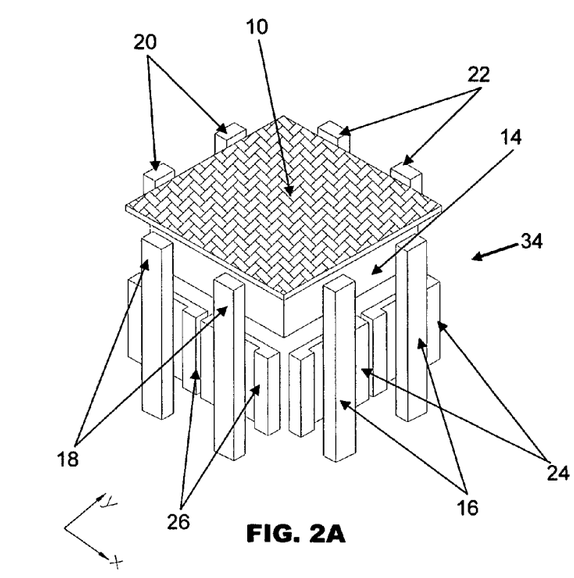
FIGS. 2A and 2B are isometric views illustrating an apparatus according to a first preferred embodiment of the invention.
Figure 2B:
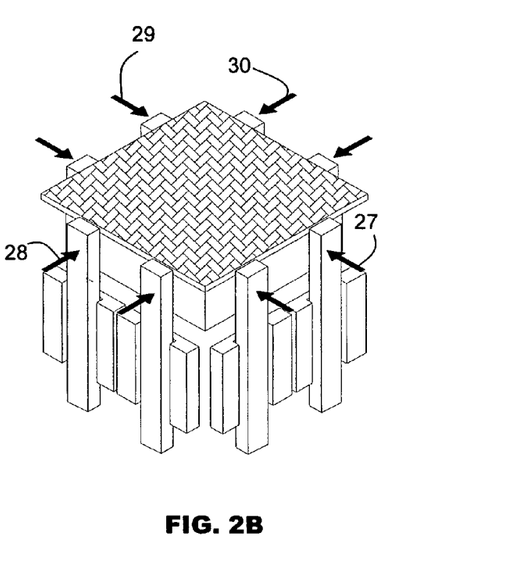

FIGS. 2A and 2B are isometric views illustrating an apparatus according to a first preferred embodiment of the invention. The apparatus generally comprises a clamping device in the form of a clamping block 34 to grip the semiconductor device 10 and for arranging it for processing. Four sets of clamps 16, 18, 20, 22 are mounted on four sides of the clamping block 34 corresponding to the four sides of the device 10 whereby to grip the same. A first set of clamps 20,22 is configured for gripping the semiconductor device 10 along a first axis (such as an X axis) and a second set of clamps is configured for gripping the semiconductor device 10 along a second axis (such as a Y axis). Each clamp may comprise one or more clamping arms to grip the device 10. In this illustrative example, each clamp comprises two clamping arms located at each side of the clamping block 34. Each of the clamps 16, 18, 20, 22 has an actuator to control the opening and closing of the clamp. The semiconductor device 10 is seated on a device support 14 substantially at the center of the four sets of clamps.

Each of the first and second sets of clamps includes a reference clamp 16, 18 that is adjustable to provide a reference guiding edge for alignment of the semiconductor device 10 along the respective X and Y axes. One of the reference clamps 16 is set in the X axis and the other of the reference clamps 18 is set in the Y axis. They are provided with adjustable stoppers 24, 26 coupled to the reference clamps 16, 18 to control the stopping position of the clamps at the end of their travel and to provide reference guiding edges for device alignment. With proper adjustment of the stopping position, these two sets of reference clamps 16, 18 provide the X and Y reference guiding edges for alignment of the semiconductor device 10 in the X, Y and theta directions. Opposite to each reference clamp 16, 18 is a gripping clamp, which may be in the form of précisor clamps 20, 22. They are operable to cooperate with the reference clamps 16, 18 to clamp the semiconductor device 10 along the respective X and Y axes. The précisor clamps 20, 22 preferably do not require stoppers.

Each semiconductor device 10 is seated substantially centrally on a device support 14 with the four sets of clamps 16, 18, 20, 22 being actuable to grip the device 10. The semiconductor device 10 will be aligned with the X and Y reference clamps 16, 18 as the actuation forces 27, 28, 29, 30 cause the four sets of clamps to close. Besides aligning the semiconductor device 10, the clamps 16, 18, 20, 22 are also configured to grip the semiconductor device 10 with sufficient holding force to prevent dislodgement of the semiconductor device 10 during subsequent processing of the device.

Figure 3:
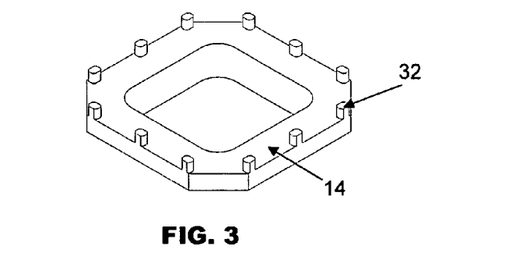
FIG. 3 is an isometric view of a device support including small protruding islands for supporting a semiconductor device.

FIG. 3 is an isometric view of a device support 14 including protrusions, such as small protruding islands 32, for supporting a semiconductor device 10 without interfering with the surface components 12 formed on the support surface of the device 10. The islands 32 are preferably extruded, and arranged and positioned at areas on the support surface of the device 10 such that they avoid contact with surface components 12. In this way, the device 10 can be supported in space without interfering with the surface components 12. Different arrangements of the surface components 12 may thus require different arrangements of the protruding islands 32, and the device support 14 may be fabricated accordingly.

The device support 14 is provided at substantially the center of the clamping block 34. Therefore, the semiconductor device 10 can be supported and positionable on a vertical Z-level without interfering with the surface components 12 on the supporting surface. It is recommended to control the vertical level of the semiconductor device 10 such that the clamps 16, 18, 20, 22 grip the device 10 at a level lower than the top or processed surface of the device 10, preferably by about ¼ of the thickness of the device 10 below the processed surface, but still high enough to ensure secure clamping. This ensures the level above the device top surface is free for access by other process tooling, and at the same time the clamping is high enough to provide a stable clamping condition to the device for secure clamping.

Figure 4:
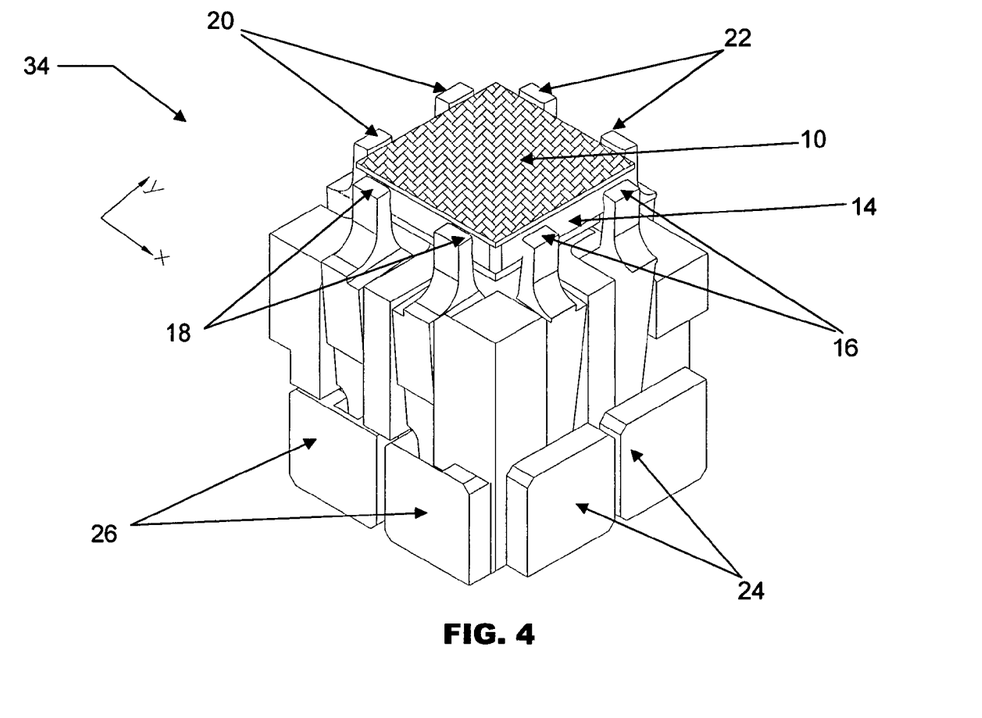
FIG. 4 is an isometric view illustrating an apparatus according to a second preferred embodiment of the invention including a modified clamping block for clamping a device.

FIG. 4 is an isometric view illustrating an apparatus according to a second preferred embodiment of the invention including a modified clamping block 34 for clamping a device 10. In this embodiment, each of the clamps 16, 18, 20, 22 is supported by and pivotable about a pivot shaft 38 (see FIG. 5A) during actuation of the clamps. Actuators 36 located at the bottom of the clamping block 34 are operable to actuate the clamping motion by turning the clamps about the pivot shafts 38. However, it should be understood that other mechanisms can also be used to control the clamping motion, such as a linear guiding system with a pusher to push the clamp.

One set of the X direction clamps 16 and one set of the Y direction clamps 18 (reference clamps) mounted on the clamping block 34 are equipped with adjustable stoppers 24, 26. As the actuator 36 pushes the bottom portion of reference clamp 16, 18 against the stopper 24, 26, the upper portion of the reference clamp 16, 18 closes and stops at a position which can be adjusted by the stopper 24, 26. Therefore it can provide the reference guiding edges for semiconductor device alignment in both the X and Y directions.

Figure 5A:
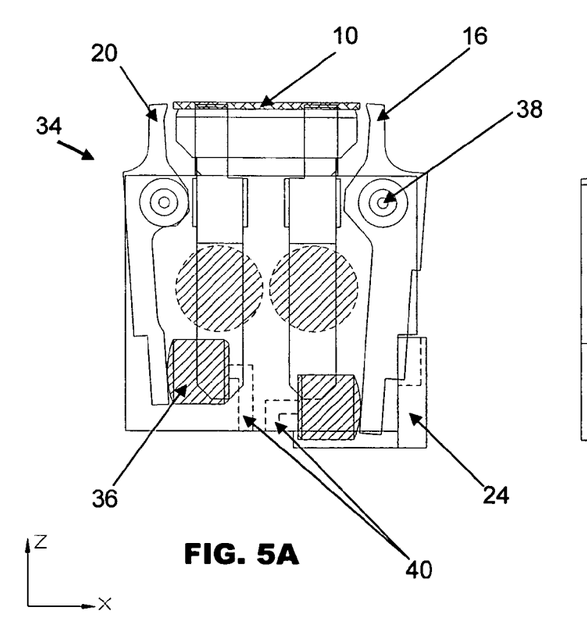
FIGS. 5A and 5B are cross-sectional views of the clamping block shown in FIG. 4 in an opened and a closed position respectively.
Figure 5B:
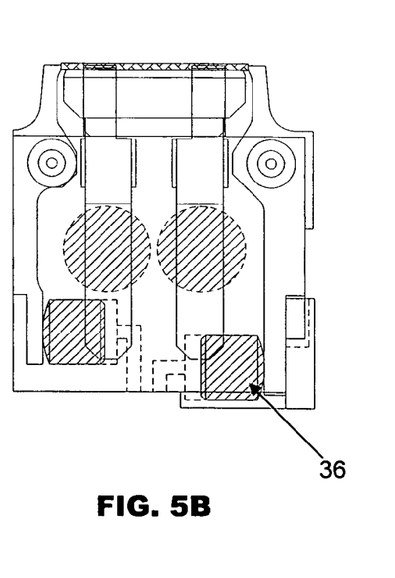

FIGS. 5A and 5B are cross-sectional views of the clamping block shown in FIG. 4 in an open and a closed position, respectively. The clamping block 34 uses an air cylinder 40 as a means to drive actuators 36 to actuate the clamps. The adjustable stoppers 24, 26 are provided to the reference clamps 16, 18 to control the extent of movement of the same. Each adjustable stopper 24, 26 has a certain height extending along a substantial length of the lower portion of the corresponding reference clamp 16, 18. Actuators 36 actuating the reference clamps are aligned with the stopper such that each actuator is positioned entirely within a space defined by the height of the corresponding stopper.

FIG. 5B shows the air cylinder 40 pushing the reference clamp 16 to bias against the stopper 24 to control the stopping position of the reference clamp 16. This will provide the reference guiding edge for the semiconductor device 10.

The précisor clamps 20, 22 are located on opposite sides of the device 10 from the reference clamps 16, 18. Unlike the reference clamps 16, preferably no adjustable stoppers are provided to the précisor clamps 20, 22. As the actuator 36 pushes the précisor clamp 20, the précisor clamp 20 biases the semiconductor device 10 in against the opposite reference edges and removes any initial clearance in between the reference clamps 16 and device edges. This aligns the semiconductor device 10 with the X and Y reference clamps 16, 18 in the clamping block 34. At the same time, the semiconductor device 10 is also gripped in position by the clamps 16, 18, 20, 22 to withstand the lifting force that may be experienced during subsequent processing.

Though various types of actuators can be used to actuate the clamps in the clamping block 34, the air cylinder 40 is preferred to drive the actuators 36 for the clamps 16, 18, 20, 22. On the one hand, by using the air cylinder 40 as an actuator, the clamp gripping motion can be readily controlled by controlling an air flow rate to the air cylinder 40 to moderate the clamping speed. This can avoid sudden and strong impact of clamps to the semiconductor device 10 which may cause the devices to jump out of the clamping block 34. On the other hand, the gripping force of the clamps can also be easily controlled by controlling the air supply pressure to the air cylinder 40. Independent control of clamping stroke and gripping force of the individual clamps can highly facilitate the alignment process, as will be shown below.

An electrical solenoid is another preferred actuator. The force and speed of this type of actuator can be controlled by changing the supplied current, and it may provide a similar effect to that of the air cylinder 40.

Figure 6A:
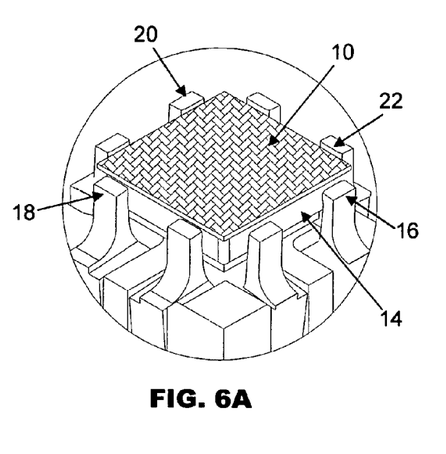
FIGS. 6A and 6B are isometric views of a semiconductor device seated on the device support before and after being clamped by the clamping block respectively.
Figure 6B:
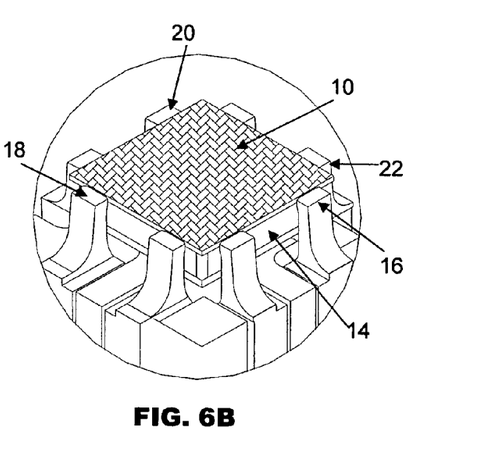

FIGS. 6A and 6B are isometric views of a device 10 seated on the device support 14 before and after being clamped by the clamping block 34 respectively. FIG. 6A shows the semiconductor device 10 seated in the device support 14 before the clamps 16, 18, 20, 22 close. The semiconductor device 10 is not yet aligned with the reference clamps 16, 18 as clearances exist in between the semiconductor device 10 and four side clamps 16, 18, 20, 22.

In FIG. 6B, the clearance between the semiconductor device and clamps is removed as the clamps are closed. The semiconductor device 10 is aligned with the X and Y direction reference clamps 16, 18 and is also gripped in position by the four side clamps 16, 18, 20, 22 at the same time for subsequent processing.

As the four sets of clamps 16, 18, 20, 22 close to grip the semiconductor device 10 seated at the center of the device support 14, the précisor clamps 20, 22 push the semiconductor device 10 in against the reference clamps 16, 18 in both X and Y directions, and thus the semiconductor device 10 is aligned with the two reference clamps 16, 18. At the same time, the clamps 20, 22 provide a gripping force to hold the semiconductor device against lifting forces that may be experienced in subsequent processes (eg. flux sticky force on BGA device in a pin transfer process). This provides a method which is feasible to align and hold a semiconductor device 10 at the same time even with surface components 12 populated on the support side of a device 10.

Figure 7:
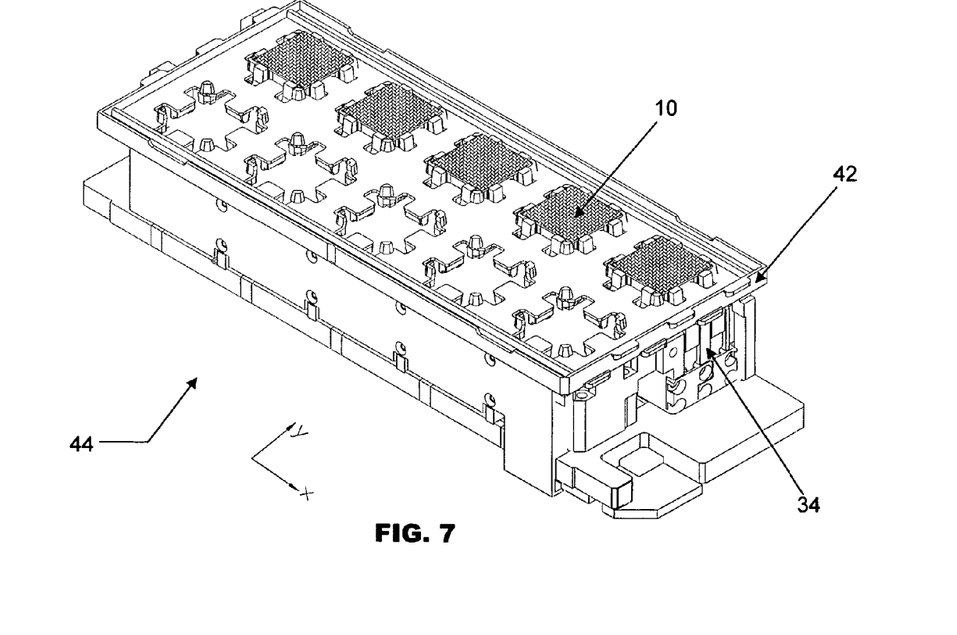
FIG. 7 is an isometric view of a carrier comprising a plurality of apparatus for aligning multiple semiconductor devices simultaneously according to another preferred embodiment of the invention.

The above alignment method is not limited to aligning a single semiconductor device. It can also be applied to align a plurality of devices. FIG. 7 is an isometric view of a carrier 44 comprising a plurality of clamping blocks 34 for aligning multiple semiconductor devices 10 simultaneously according to another preferred embodiment of the invention. Arrays of pockets are formed on a top surface 42 of the carrier 44 with each pocket accommodating one semiconductor device 10. Each pocket has openings at four sides of the device for access of its four edges by the clamps of the clamping blocks 34 to align and grip a semiconductor device 10. The arrays of clamping blocks are mounted in a push block corresponding to each tray pocket position. By aligning the stopping positions of the X and Y reference clamps in each clamping block by using an adjustable stopper, multiple devices can be aligned together simultaneously for subsequent processing while being clamped on the carrier 44.

Figure 8:
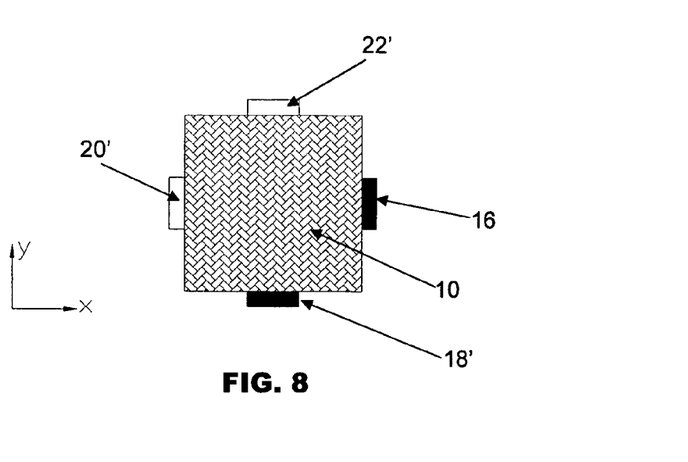
FIG. 8 is an elevation view a semiconductor device that has been clamped by four clamps, each of which comprises a single clamping arm.

Though a clamping block 34 with a pair of clamps at each of the four sides of a device 10 is used as an illustration, it should be understood that the number of clamps at each side of a device can be reduced to one to accommodate small form factor semiconductor devices. FIG. 8 is an elevation view a semiconductor device 10 that has been clamped by four clamps, each of which comprises a single clamping arm 16', 18', 20' 22' on each side of a device 10. This is suitable for use with small form factor semiconductor devices 10 due to limited space for access to the four sides of the device 10.

Figure 9:
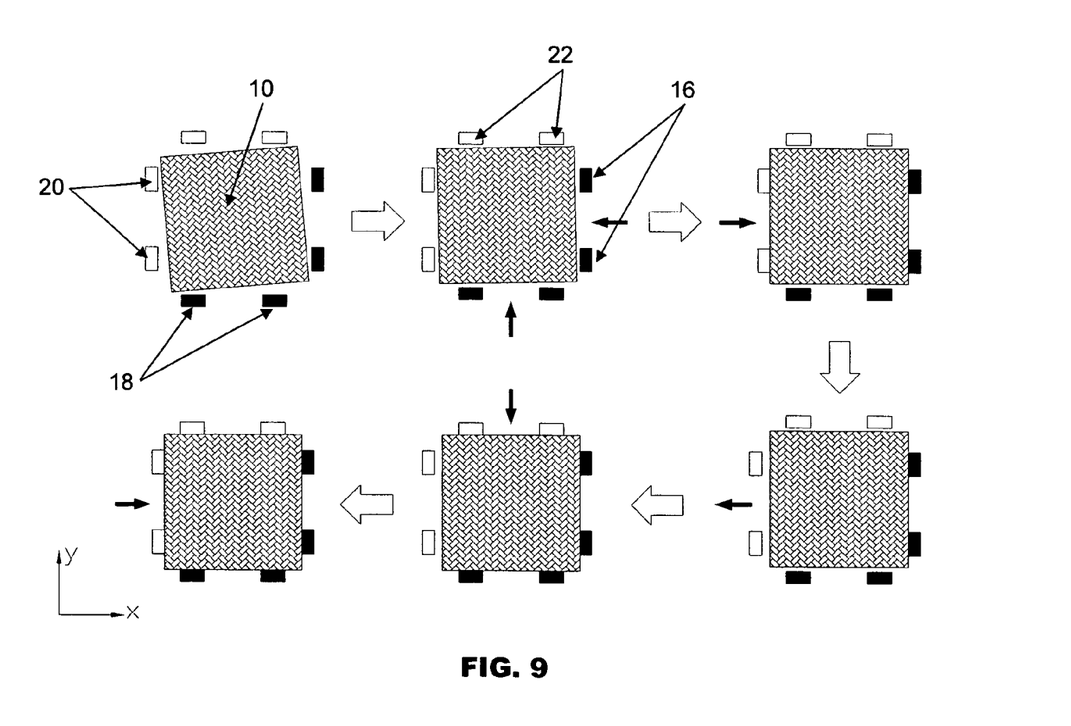
FIG. 9 illustrates a preferred clamping sequence for aligning a device using the illustrated apparatus according to the invention.

FIG. 9 illustrates a preferred clamping sequence for aligning a semiconductor device 10 using the illustrated apparatus according to the invention for achieving alignment of the device 10.

Instead of closing all of the clamps in the clamping block 34 at the same time to align and hold the device 10, the following clamping sequence is proposed to facilitate the alignment process of semiconductor device 10. Firstly, the X and Y reference clamps 16, 18 close to provide guiding reference edges to the semiconductor device 10. Secondly, the X précisor clamp 20 closes to align the semiconductor device 10 against the X reference clamp 16. Thirdly, the X précisor clamp 20 is opened, and leaves the semiconductor device 10 closely aligned with the X reference clamp 16 with only a very minimal clearance. Fourthly, the Y précisor clamp 22 closes to align the semiconductor device against the Y reference clamp 18.

It is preferred that the semiconductor device is not gripped by X direction precisor clamps 20 during the closing of the Y précisor clamp 22, since it will introduce scratches to the edges of semiconductor device 10 due to sliding between semiconductor device 10 and the X direction clamps 16, 20 under friction. This affects the cosmetic appearance of the semiconductor device 10 even if there is no damage to its electrical components.

The final step is to close the X précisor clamp 20 to remove the minimal clearance between semiconductor device 10 and X reference clamp 16 remaining from the previous clamping sequence.

With the minimal initial clearance between semiconductor device 10 and X reference clamp 16, the X précisor clamp 20 can then align the semiconductor device 10 against the X reference clamp 16 without introducing scratch damage to the device 10.

It should be appreciated that the aforesaid alignment method does not require accessing a significant portion of the support surfaces of the semiconductor devices 10. Therefore, it is applicable to semiconductor devices 10 which are highly populated with surface components 12 on the support surface. Besides aligning the semiconductor device 10, it also provides a gripping force to the semiconductor device 10 at the same time to withstand pick up forces exerted on the semiconductor device 10 that may be experienced in subsequent processes. The proposed clamping sequence can therefore result in scratch free alignment with virtually no clearance, which provides greater accuracy.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for arranging a semiconductor device for processing, the semiconductor device having surface components on its surface and having sides, the apparatus comprising:

a device support comprising a set of protrusions configured and positioned to contact the surface of the semiconductor device without contacting the surface components on the surface of the semiconductor device, the set of protrusions being configured to support the semiconductor device on a plane;

a clamping device having a first set of clamps configured for gripping the sides of the semiconductor device along a first axis and the clamping device further having a second set of clamps configured for gripping the sides of the semiconductor device along a second axis perpendicular to the first axis;

each of the first and second set of clamps comprising a reference clamp having a reference guiding edge and a predetermined end position for clamping the semiconductor device, the reference guiding edge being movable into the predetermined end position and being operable for alignment of the semiconductor device along a respective axis, the reference clamp further having a lower portion and a pivot shaft positioned between the reference guiding edge and the lower portion, the reference clamp being pivotable around the pivot shaft;

each of the first and second set of clamps further comprising a gripping clamp located opposite to the reference clamp of the same set, the gripping clamp having an end position which is defined by an edge of the semiconductor device being clamped and being operable to provide a gripping force onto the semiconductor device to clamp the semiconductor device against the reference guiding edge of the reference clamp along the respective axis;

an adjustable stopper coupled to the reference clamp, the adjustable stopper defining the predetermined end position of the reference clamp, the adjustable stopper having a height extending along a substantial length of the lower portion of the reference clamp, the stopper being operable to control an end position of the lower portion of the reference clamp; and an actuator operable to drive the lower portion of the reference clamp into the end position in which the lower portion is fixedly secured between the actuator and the stopper, the actuator being aligned with the stopper such that the actuator is positioned entirely within a space defined by the height of the stopper.

2. An apparatus as claimed in claim 1, wherein the clamps are further configured to grip the sides of the semiconductor device with sufficient holding force to prevent dislodgement of the semiconductor device during processing.

3. An apparatus as claimed in claim 1, wherein the clamps are configured to grip the sides of the semiconductor device at a level located lower than a processed surface of the semiconductor device.

4. An apparatus as claimed in claim 3, wherein the clamps are configured to grip the sides of the semiconductor device at the level located approximately ¼ of the thickness of the semiconductor device below the processed surface.

5. An apparatus as claimed in claim 1, wherein the actuator comprises an air cylinder.

6. An apparatus as claimed in claim 1, wherein the actuator comprises an electrical solenoid.

7. An apparatus as claimed in claim 1, including a carrier configured for mounting a plurality of clamping devices so as to arrange a plurality of semiconductor devices on the carrier, each clamping device being operable to align and grip sides of one of the semiconductor devices.

8. An apparatus as claimed in claim 7, wherein the plurality of clamping devices are configured to align and grip sides of all the semiconductor devices simultaneously.

9. An apparatus as claimed in claim 1, wherein each clamp comprises two clamping arms.

10. An apparatus as claimed in claim 1, wherein the device support is located substantially centrally of the clamping device.

11. An apparatus for arranging a plurality of semiconductor devices for processing, each semiconductor device having surface components on its surface and having sides, the apparatus comprising:
- a plurality of device supports, each device support comprising a set of protrusions configured and positioned to contact the surface of one of the semiconductor devices without contacting surface components on the surface of the one of the semiconductor devices, the set of protrusions being configured to support the one of the semiconductor devices on a plane;
- a plurality of clamping devices, each clamping device having a first set of clamps configured for gripping the sides of the one of the semiconductor devices along a first axis and each clamping device further having a second set of clamps configured for gripping the sides of the one of the semiconductor devices along a second axis perpendicular to the first axis;
- each of the first and second set of clamps comprising a reference clamp having a reference guiding edge and a predetermined end position for clamping the semiconductor device, the reference guiding edge being movable into the predetermined end position and operable for alignment of the semiconductor device along a respective axis, the reference clamp further having a lower portion and a pivot shaft positioned between the reference guiding edge and the lower portion, the reference clamp being pivotable around the pivot shaft;
- each of the first and second set of clamps further comprising a gripping clamp located opposite to the reference clamp of the same set, the gripping clamp having an end position which is defined by an edge of the semiconductor device being clamped and being operable to provide a gripping force onto the semiconductor device to clamp the semiconductor device against the reference guiding edge of the reference clamp along the respective axis;
- a plurality of adjustable stoppers, each adjustable stopper being coupled to one of the reference clamps, each adjustable stopper defining the predetermined end position of the coupled reference clamp, each adjustable stopper having a height extending along a substantial length of the lower portion of the coupled reference clamp, and each stopper being operable to control an end position of the lower portion of the associated reference clamp; and
- a plurality of actuators, each actuator being associated with one of the reference clamps and each actuator being operable to drive the lower portion of the associated reference clamp into the end position in which the lower portion is fixedly secured between the actuator and the stopper, each actuator being aligned with an adjustable stopper coupled to the associated reference clamp such that each actuator is positioned entirely within a space defined by the height of the coupled stopper; and
- a carrier for mounting the plurality of clamping devices and device supports.

* * * * *